United States Patent [19]

Onizuka

[11] Patent Number: 5,559,433
[45] Date of Patent: Sep. 24, 1996

[54] MAGNETIC SENSOR DEVICE INCLUDING APPARATUS FOR ALIGNING A MAGNETORESISTANCE ELEMENT AND A CIRCUIT BOARD AND A METHOD OF MANUFACTURING THE MAGNETORESISTIVE DEVICE

[75] Inventor: Shoko Onizuka, Itami, Japan

[73] Assignee: Mitsubishi Denki Kabushiki Kaisha, Tokyo, Japan

[21] Appl. No.: 191,452

[22] Filed: Feb. 3, 1994

[30] Foreign Application Priority Data

Feb. 4, 1993 [JP] Japan .................... 5-017424

[51] Int. Cl.$^6$ .................. G01B 7/30; H05K 3/30; H01L 43/08; G01R 33/06
[52] U.S. Cl. .................. 324/207.21; 324/202; 324/252; 29/834; 29/835; 174/52.1
[58] Field of Search .................. 324/173, 174, 324/202, 207.20, 207.21–207.26, 251, 252; 338/32 H, 32 R; 29/846, 834, 835, 847; 174/255; 123/612, 617

[56] References Cited

U.S. PATENT DOCUMENTS

| | | | |
|---|---|---|---|
| 4,769,600 | 9/1988 | Ito | 324/207.25 X |
| 4,833,406 | 5/1989 | Foster | 324/251 |
| 5,014,005 | 5/1991 | Murata et al. | 324/207.2 |
| 5,122,741 | 6/1992 | Ohsumi | 324/207.25 |
| 5,237,272 | 8/1993 | Murata et al. | 324/207.2 |
| 5,278,497 | 1/1994 | Ariyoshi | 324/207.21 |

FOREIGN PATENT DOCUMENTS

| | | | |
|---|---|---|---|
| 62-22470 | 1/1987 | Japan . | |
| 0212789 | 8/1990 | Japan | 324/207.21 |
| 2305412 | 12/1990 | Japan . | |
| 396287 | 4/1991 | Japan . | |
| 0195970 | 8/1991 | Japan | 324/207.21 |

Primary Examiner—Sandra L. O'Shea
Assistant Examiner—Jay M. Patidar
Attorney, Agent, or Firm—Leydig, Voit & Mayer

[57] ABSTRACT

A magnetic sensor device having output characteristics with high precision and a method of manufacturing the same. A thick film resistor is trimmed while a magnetic field is applied to a circuit board at a predetermined angle, thereby adjusting output characteristics of a hybrid integrated circuit on the circuit board and eliminating undesirable misalignment of the mounting position between an MR device and the circuit board. Subsequently, a dowel recess used as a first positioning member formed on the circuit board receives a dowel projection used as a second positioning member formed on a frame, the dowel projection complementary to the dowel recess, thus positioning and assembling the circuit board into the frame. The output characteristics obtained during trimming conform with those after assembly, thus obtaining a magnetic sensor device having output characteristics with high precision and achieving correct detection as a sensor.

7 Claims, 6 Drawing Sheets

5,559,433

MAGNETIC SENSOR DEVICE INCLUDING APPARATUS FOR ALIGNING A MAGNETORESISTANCE ELEMENT AND A CIRCUIT BOARD AND A METHOD OF MANUFACTURING THE MAGNETORESISTIVE DEVICE

BACKGROUND OF THE INVENTION

1. Field of the Invention

The present invention relates to a magnetic sensor device, and more particularly, to a magnetic sensor device which has an orthogonal-type thin film magnetoresistive element (hereinafter referred to as an MR element) and which is used for the angle detection, position detection and the like. The invention also relates to a method of manufacturing the same device.

2. Description of the Related Art

FIG. 10 is a top view illustrating one example of a known magnetic sensor device. Referring to FIG. 10, an MR element 1, a semiconductor device (hereinafter referred to as an IC chip) 2 and a multilayer capacitor 5 are mounted on a ceramic circuit board 3 and a thick film resistor 4 and wiring (not shown) are further printed, thus forming a hybrid integrated circuit on the circuit board 3. A plurality of leads 6 are also mounted on the circuit board 3. The circuit board 3 is inserted to a frame 8 equipped with a magnet 7, thereby completing the assembly. The magnet 7 is a substantially disk shaped member and a coaxial rotary shaft 7a is attached to the bottom of the magnet 7, thereby rotatably supporting the magnet 7 to the frame 8.

The MR element 1 made of a ferromagnetic substance, such as Ni, Co and Fe, is formed in a strip-like shape on the circuit board 3. FIG. 11 is a block diagram of the MR element 1. As shown in FIG. 11, in the MR element 1, two ferromagnetic resistors 1a and 1b used as a sensor portion are arranged at right angles to each other and connected in series at the junction B. Such an MR element 1 is referred to as an orthogonal-type element in which the currents flowing in the respective ferromagnetic resistors 1a and 1b meet at right angles. The ferromagnetic resistors 1a and 1b have the same resistance. Thin films may be formed in an elongated bar-like shape as both ferromagnetic resistors 1a and 1b, but instead, as illustrated, for example, in FIG. 12, they also may be formed in a zigzag shape in order to highly increase the impedance of the MR element 1 and also to downsize the MR element 1. In the latter case, the ferromagnetic resistors 1a and 1b are formed symmetrical with respect to the phantom line A—A. The currents flowing in any portions symmetrical to each other in the respective ferromagnetic resistors 1a and 1b also intersect at right angles.

When a current flows into the MR element 1 and the magnet 7 is rotated, the angle between the current flowing in the MR element 1 and the magnetic field generated by the magnet 7 varies in accordance with the rotation of the magnet 7, thereby continuously changing the resistance of the MR element 1. This is called the magnetoresistance effect. By making use of this effect, the magnetic sensor device equipped with the MR element 1 illustrated in FIG. 10 converts a variance in the angle between the current and the magnetic field into a change in the voltage, thereby performing angle and position detection. The rotary shaft 7a provided for the magnet 7 is operationally connected for cooperation with the rotary shaft of a rotating member to be detected (not shown). The magnet 7 is rotated in accordance with the rotation of the rotary shaft of the rotating member, thereby changing the angle of the magnetic field applied to the MR element 1. Thus, the resistance of the MR element 1 is also varied due to the above magnetoresistance effect, and the output voltage of the overall hybrid integrated circuit is accordingly varied. As a result, the rotation angle of the rotating member can be detected. Such a magnetic sensor device is now widely used for automobiles, VTR motors, office automation devices, factory automation devices, etc.

The description will now be given of a method of manufacturing the magnetic sensor device. The hybrid integrated circuit illustrated in FIG. 10 is first formed on the circuit board 3. Then, a thick film resistor 4 in the hybrid integrated circuit is trimmed to adjust output characteristics of the hybrid integrated circuit. A method of adjustment is employed whereby the thick-film resistor 4 is cut by a laser beam, or the like, thereby gradually varying the resistance of the thick-film resistor 4 so that the output of the overall hybrid integrated circuit reaches a predetermined reference voltage. Subsequently, the leads 6 are arranged on the circuit board 3 which is then assembled into the frame 8 equipped with the magnet 7.

As stated above, in the known magnetic sensor device, the thick film resistor 4 is trimmed without applying the magnetic field to the MR element 1 before the circuit board 3 is assembled into the frame 8, thus adjusting the output characteristics of the hybrid integrated circuit on the circuit board 3. As described above, the orthogonal-type MR element 1 shown in FIG. 11 is formed in such a way that the ferromagnetic resistors 1a and 1b have the same resistance when the magnetic field is not applied, i.e., R1=R2. After the circuit board 3 is assembled into the frame 8, however, the resistance values of both ferromagnetic resistors 1a and 1b differ from each other due to a change in the angle of the magnetic field generated by the magnet 7. As indicated by the arrows shown in FIG. 11, when the horizontal magnetic field is accurately applied to the MR element 1, the angle between the magnetic field and the current flowing in the resistors 1a and 1b is constant, thus equalizing the resistance of both resistors 1a and 1b. That is, in the cases where the horizontal magnetic field is applied and where the magnetic field is not applied at all, the voltage across A and B is equal to that across B and C, and thus, if the same power voltage supplied to the two resistors 1a and 1b, the same output voltage should be obtained. However, if the MR element 1 slipped out of place or is misaligned with respect to the circuit board 3 when it was mounted, or if the circuit board 3 slipped out of place or is misaligned with respect to the frame 8, the angle between the MR element 1 and the magnetic field generated by the magnet 7 becomes changed from the proper one. Therefore, the output voltage gained by applying the horizontal magnetic field to the MR element 1 after assembly does not match the reference voltage adjusted during trimming in the absence of the magnetic field, thus lowering the precision of the output characteristics, further resulting in a failure in correct detection as a sensor. It is also very difficult to trim the thick film resistor 4 on the substrate 3 after assembly.

SUMMARY OF THE INVENTION

Accordingly, in order to overcome the above drawbacks, an object of the present invention is to provide a magnetic sensor device for detecting a correct value, in which the angle between the magnetic field from the magnet 7 and the MR element 1 is not varied, thus conforming the output characteristics during trimming to those after assembly and further improving the precision of the output characteristics, and also to provide a method of manufacturing the same magnetic sensor device.

In order to achieve the above object, according to a first aspect of the present invention, there is provided a magnetic sensor device comprising: a frame; a circuit board mounted on the frame; a sensor circuit having an orthogonal-type magnetoresistance element mounted on the circuit board; a magnet movably supported by the frame, the magnet facing the magnetoresistance element and applying a magnetic field thereto; and positioning means disposed between the circuit board and the frame for positioning the circuit board relative to the frame.

According to a second aspect of the present invention, there is provided a magnetic sensor device comprising: a frame; a circuit board mounted on the frame; a sensor circuit having an orthogonal-type magnetoresistance element mounted on the circuit board; a magnet movably supported by the frame, the magnet facing the magnetoresistance element and applying a magnetic field thereto; and positioning means disposed on the frame for engaging with the magnetoresistance element, thereby positioning the magnetoresistance element relative to the frame.

According to a third aspect of the present invention, there is provided a magnetic sensor device substantially as described with respect to the first aspect of the invention, wherein said positioning means comprises means disposed on the circuit board for positioning the magnetoresistance element relative to the circuit board.

According to a fourth aspect of the present invention, there is provided a method of manufacturing a magnetic sensor device comprising the steps of: forming a sensor circuit on a circuit board, the sensor circuit having an orthogonal-type magnetoresistance element; trimming the sensor circuit while a magnetic field is applied to the circuit board at a predetermined angle so that the output characteristics of the sensor circuit match a predetermined reference value obtained in the magnetic field at the predetermined angle; preparing a frame for mounting the circuit board, the frame including positioning means for engaging with the circuit board and a magnet movably supported by the frame; and engaging the positioning means with the circuit board so as to position the circuit board relative to the frame and mounting the circuit board on the frame.

According to a fifth aspect of the present invention, there is provided a method of manufacturing a magnetic sensor device comprising the steps of: forming a sensor circuit on a circuit board, the sensor circuit having an orthogonal-type magnetoresistance element; trimming the sensor circuit so that the output characteristics of the sensor circuit match a predetermined reference value; preparing a frame to mount the circuit board, the frame including positioning means for engaging with the magnetoresistance element and including a magnet movably supported by the frame; and engaging the positioning means with the magnetoresistance element so as to position the magnetoresistance element relative to the frame and mounting the circuit on the frame.

According to a sixth aspect of the present invention, there is provided a method of manufacturing a magnetic sensor device comprising the steps of: providing first positioning means on a circuit board for positioning an orthogonal-type magnetoresistance element to be mounted on the circuit board; positioning the magnetoresistance element by the first positioning means so as to mount the magnetoresistance element on the circuit board; forming a sensor circuit on the circuit board, the sensor circuit having the magnetoresistance element; trimming the sensor circuit so that the output characteristics of the sensor circuit match a predetermined reference value; preparing a frame to mount the circuit board, the frame including a second positioning means for engaging with the circuit board and including a magnet movably supported by the frame; and engaging the second positioning means with the circuit board so as to position the circuit board relative to the frame and mounting the circuit board on the frame.

According to a seventh aspect of the present invention, there is provided a method of manufacturing a magnetic sensor device comprising the steps of: forming a sensor circuit on a circuit board, the sensor circuit having an orthogonal-type magnetoresistance element; trimming the sensor circuit when a magnetic field is not applied so that the output characteristics of the sensor circuit match a predetermined reference value; preparing a frame for mounting the circuit board, the frame including a magnet movably supported by the frame; maintaining a magnetic field generated by the magnet at an angle such that the output characteristics of the sensor circuit can generate the same value as the predetermined reference value obtained where a magnetic field is not applied, adjusting the position of the circuit board within the frame while the output characteristics are being measured, and fixing and mounting the circuit in a predetermined position within the frame in which the output characteristics of the sensor circuit generate the same value as the predetermined reference value obtained where a magnetic field is not applied.

According to the first and fourth aspects of the present invention, the thick film resistor is trimmed as the magnetic field is applied to the circuit board at a predetermined angle, thereby adjusting the output characteristics of the hybrid integrated circuit on the circuit board, thus compensating for undesirable slip between the circuit board and the MR element. Subsequently, the circuit board and the frame are positioned by the positioning means provided therebetween, and thus, the circuit board is accurately assembled into the frame.

According to the second and fifth aspects of the present invention, the positioning means are provided on the frame for engaging with the MR element, and the MR element and the frame are directly positioned relative to each other, thus mounting the circuit board on the frame.

According to the third and sixth aspects of the present invention, in order to avoid undesirable slip of the mounting position of the MR element with respect to the circuit board, the positioning means further comprises means disposed on the circuit board for determining the mounting position of the MR element relative to the circuit board.

According to the seventh aspect of the present invention, the thick film resistor on the circuit board is trimmed when the magnetic field is not applied, and the circuit board is assembled into the frame in such a way that while the output characteristics are being measured, the substrate is mounted on the frame in the position in which the output characteristics are equivalent to the value adjusted during trimming.

BRIEF DESCRIPTION OF THE DRAWINGS

The present invention will become more readily apparent from the following detailed description of the preferred embodiments of the present invention taken in conjunction with the accompanying drawings, in which.

DETAILED DESCRIPTION OF THE PREFERRED EMBODIMENTS

Embodiments of the present invention will now be described with reference to the accompanying drawings.

Figure 1:
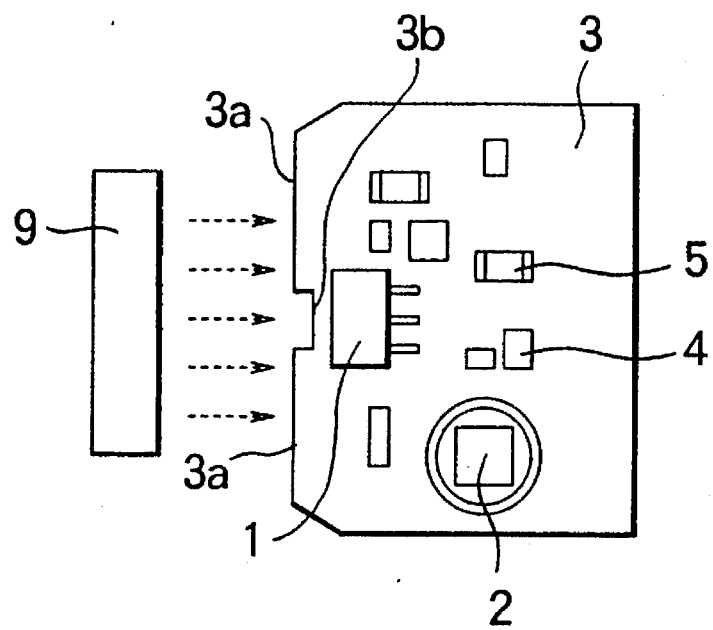
FIG. 1 is a top view illustrating a method of manufacturing a magnetic sensor device of an embodiment of the present invention.
Figure 2:
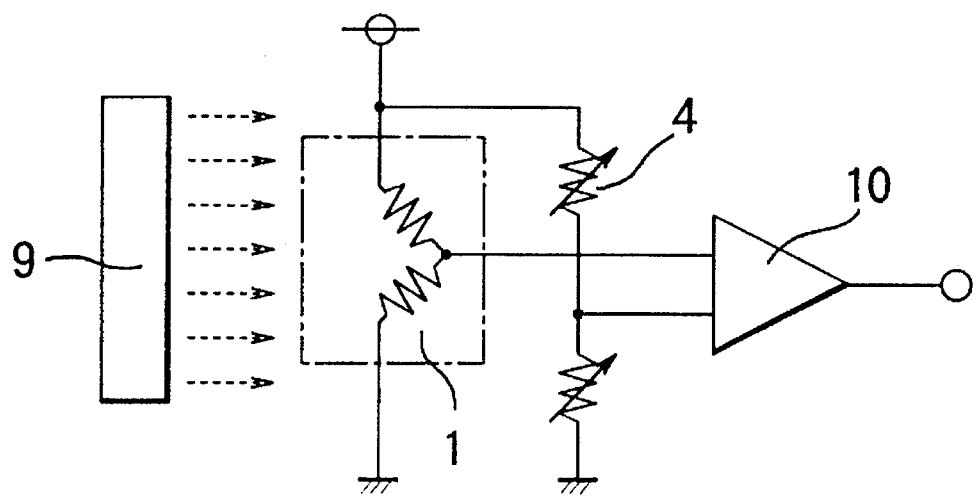
FIG. 2 is a block diagram of the magnetic sensor device shown in FIG. 1.
Figure 10:
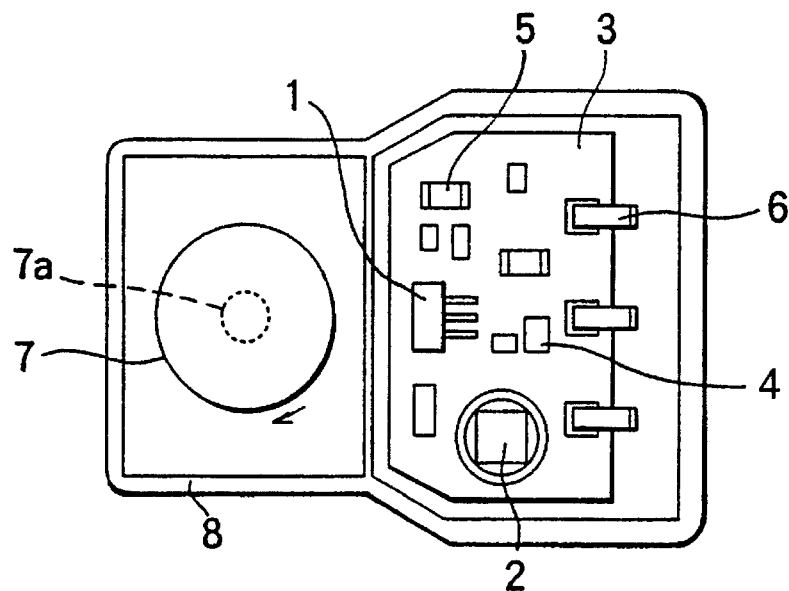
FIG. 10 is a top view of a conventional magnetic sensor device.

FIG. 1 illustrates a method of manufacturing the magnetic sensor device of the present invention. FIG. 2 is a block diagram of the magnetic sensor device. Referring to FIG. 1, components indicated by reference numerals 1–5 have been given the same reference numerals as in the conventional magnetic sensor device shown in FIG. 10, and the explanation thereof will be omitted. In this embodiment, the thick film resistor 4 is trimmed using a magnet 9 in the manufacturing process. More specifically, as shown in FIG. 1, a horizontal magnetic field generated by the magnet 9 is applied to one side 3a of the circuit board 3 when the thick film resistor 4 is being trimmed. Complementary positioning means are also arranged between the circuit board 3 and the frame 8 in order to avoid the undesirable misalignment or slip of mounting from the correct position during the assembly. A dowel recess 3b formed at the center of the side 3a of the circuit board 3 shown in FIG. 1 is one of the positioning means arranged on the circuit board 3 and it will be described later. Referring to FIG. 2, a circuit 10 is arranged in the IC chip 2 and amplifies the potential difference caused by a change in the resistance of the MR element 1 due to the magnetoresistance effect.

In the magnetic sensor device of the present invention, the thick film resistor 4 in the hybrid integrated circuit disposed on the circuit board 3 is trimmed by the following method. As illustrated in FIGS. 1 and 2, a narrow elongated magnet 9 which is sufficiently long relative to the MR element 1 is placed parallel to the side 3a of the circuit board 3 by the use of a suitable instrument, and the horizontal magnetic field generated by the magnet 9 is applied to the side 3a of the circuit board 3. The thick film resistor 4 is cut by the application of laser beams, or the like, thereby gradually varying the resistance of the thick film resistor 4 so that the output of the overall hybrid integrated circuit reaches a predetermined reference voltage and is thus desirably adjusted. The reference voltage when the horizontal magnetic field is applied is equivalent to the voltage when the magnetic field is not applied at all. The angle between the magnetic field and the circuit board 3 when trimming is performed may be set at any desired angle and, in such a case, the reference voltage may be set relating to each angle. It is linearly varied, for example, 1 V at 45°, 2.5 V at 90° and 4 V at 135° and the like.

Figure 3:
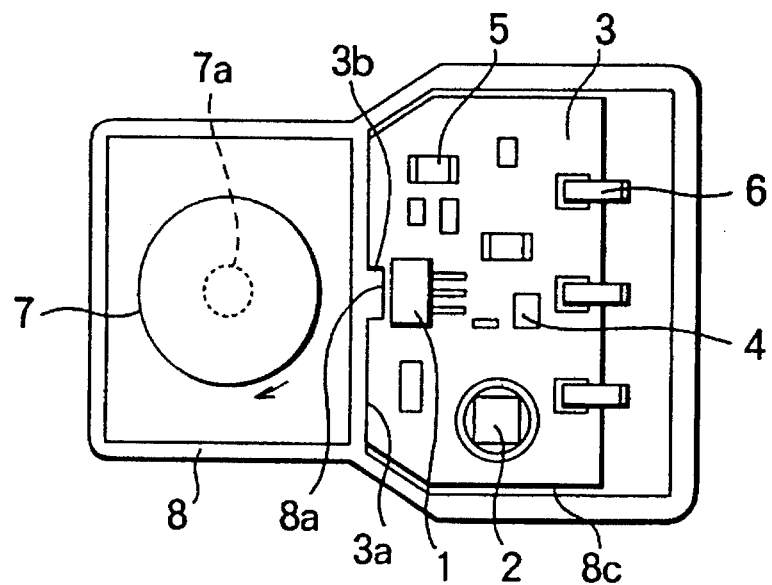
FIG. 3 is a top view of the magnetic sensor device of the present invention.

After the completion of trimming, the circuit board 3 is assembled into a board mounting portion 8c of the frame 8, as shown in FIG. 3. At this time, if the circuit board 3 has slipped out of place relative to the frame 8 undesirably, the reference voltage adjusted by trimming does not accord with the output voltage after assembly because trimming is performed while the angle of the magnetic field is adjusted on the basis of the side 3a of the circuit board 3, thus lowering the precision of the output characteristics. In order to avoid the misalignment or the undesirable slip of mounting position of the circuit board 3 when it is assembled into the frame 8, as illustrated in FIG. 1, the dowel recess 3b is disposed on the circuit board 3, and as shown in FIG. 3, a dowel projection 8a, complementary to the dowel recess 3b, is also provided on the frame 8, thereby serving as positioning means. Thus, the circuit board 3 is assembled into the frame 8 such that the dowel projection 8a is accurately fit into the dowel recess 3b, thereby positioning the circuit board 3, and the side 3a of the circuit board 3 is exactly fit into contact with one side of the inner wall of the board mounting portion 8c, at which the dowel projection 8a of the frame 8 is formed. Hence, even if the MR element 1 has slipped out of place relative to the circuit board 3, the thick film resistor 4 may be trimmed on the basis of the circuit board 3, leaving the MR element 1 as it is out of place, thereby correcting such misalignment of mounting position by means of trimming. Since the circuit board 3 is accurately assembled into the frame 8, the output characteristics of the hybrid integrated circuit while trimming conform to those after assembly, thus improving the precision of the output characteristics. The complementary dowel recess 3b and dowel projection 8a arranged on the circuit board 3 and the frame 8, respectively,, may be plural, and the dowel recess 3b may also be formed on another side of the circuit board 3 adjacent to the side 3a.

In a method of manufacturing another magnetic sensor device of the present invention, in a manner similar to the conventional sensor device, the thick film resistor 4 is first trimmed without the magnetic field being applied, thereby adjusting the output characteristics of the hybrid integrated circuit formed on the circuit board 3. The circuit board 3 is then assembled into the frame 8 according to the following method. Where the magnetic field generated by the magnet 7 is substantially perpendicular to the MR element 1, the circuit board 3 is slid slowly while the output characteristics are being measured by the use of a monitor (not shown), or the like, and is fixed in the position in which the reference voltage adjusted by trimming the thick film resistor 4 is equivalent to the output voltage of the hybrid integrated circuit. As described above, with respect to the construction of the orthogonal-type MR element 1 illustrated in FIGS. 1 and 2, when the magnetic field generated by the magnet 7 is exactly at right angles with the MR element 1, the output voltage of the hybrid integrated circuit is equivalent to the reference voltage adjusted during trimming. Even if the MR element 1 has slipped out of place relative to the circuit board 3, the reference voltage adjusted during trimming coincides with the output voltage after assembly according to this method. Thus, the slip of mounting position of the MR element 1 relative to the circuit board 3 and to the other components can be compensated and ignored, and advantages similar to those in the first embodiment shown in FIGS. 1–3 can be obtained.

Figure 4:
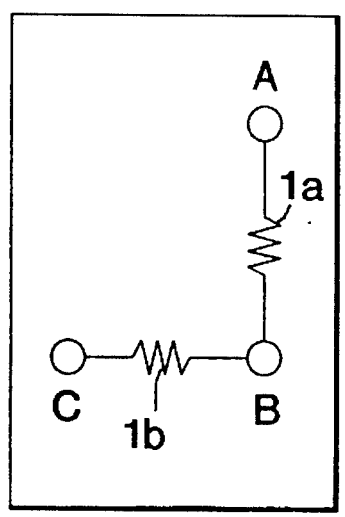
FIG. 4 is a block diagram showing another construction of an orthogonal-type MR element.
Figure 5:
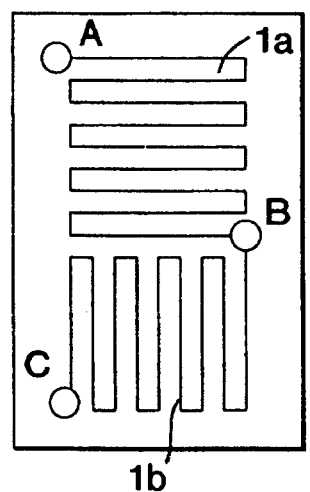
FIG. 5 is a top view illustrating one example of the pattern of the MR element shown in FIG. 4.
Figure 11:
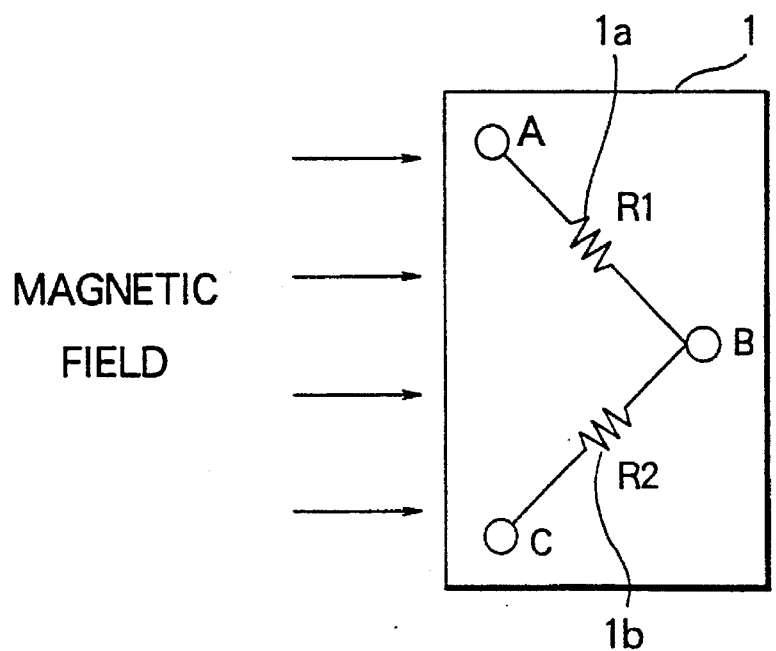
FIG. 11 is a block diagram showing one construction of the orthogonal-type MR element.
Figure 12:
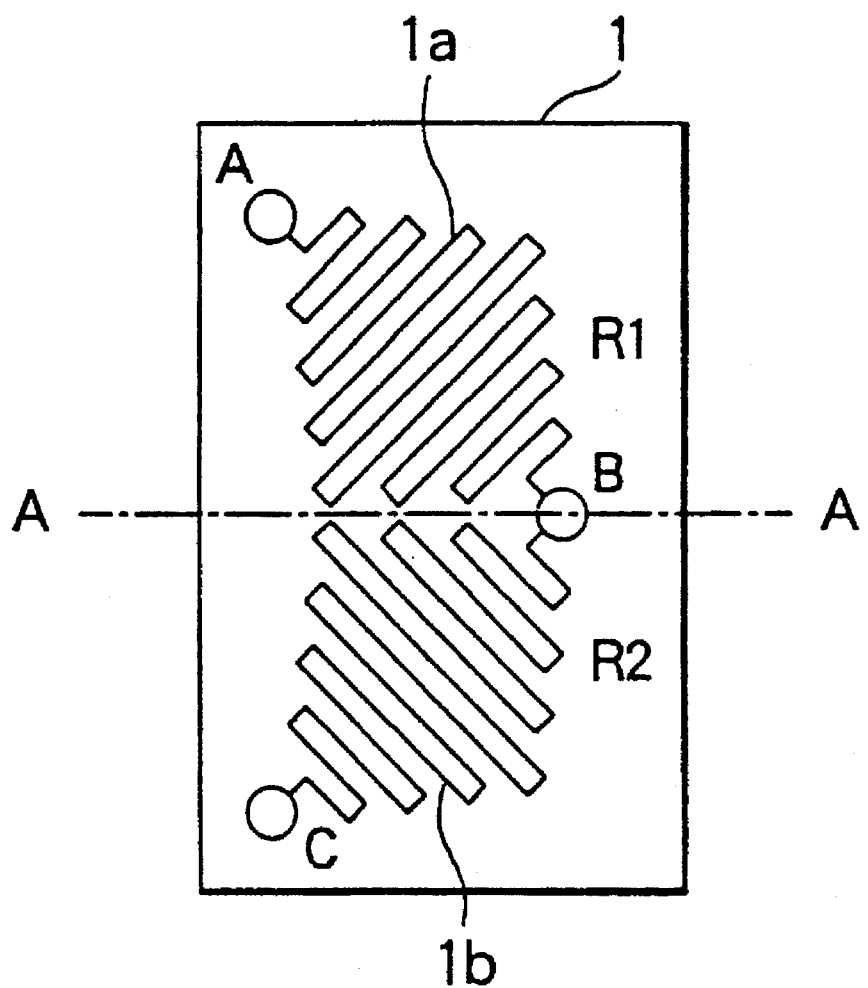
FIG. 12 is a top view showing one example of the pattern of the MR element shown in FIG. 11.

FIG. 4 is a block diagram showing another construction of the orthogonal-type MR element 1, similar to FIG. 11. Referring to FIG. 4, the components have been given the same reference numerals as the MR element shown in FIG. 11. FIG. 5 shows one example of the pattern of the downsized MR element 1 of the above type in which the impedance is highly increased. In such a case, when the magnetic field is at 45° relative to the MR element 1, the output characteristics of the hybrid integrated circuit coincide with those where the magnetic field is not applied. Consequently, trimming is first performed where the magnetic field is not applied, and subsequently, the circuit board 3 is assembled into the frame 8 while the magnetic field generated by the magnet 7 is applied to the MR element 1 at approximately 45° and while the output characteristics are measured in a manner similar to the above.

Figure 6:
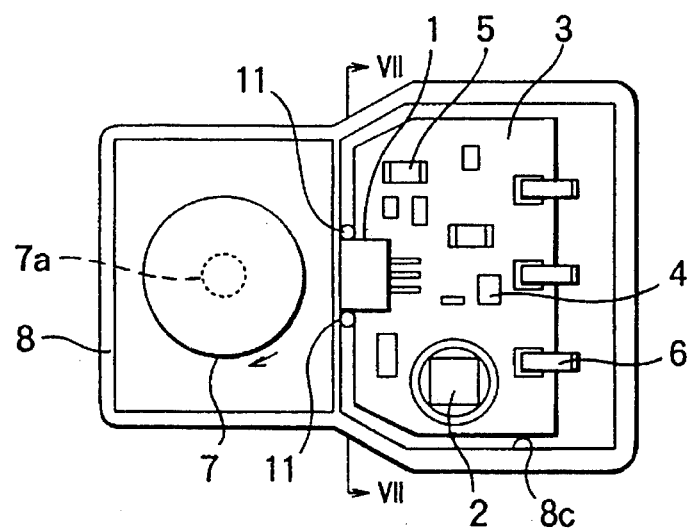
FIG. 6 is a top view of a magnetic sensor device of another embodiment of the present invention.
Figure 7:
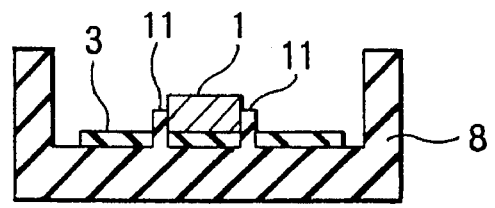
FIG. 7 is a sectional view taken along line VII—VII of FIG. 6.

FIG. 6 is a top view of another embodiment of the present invention. FIG. 7 is a sectional view taken along line VII—VII of FIG. 6. As shown in FIGS. 6 and 7, the frame 8 of this embodiment is provided with dowel pins 11 for the engagement with the MR element 1 in order to prevent MR element 1 from slipping out of place when it is mounted. Components indicated by reference numerals 1–5 are assigned to the same components as in the previous embodiments, and thus, an explanation thereof will be omitted. As illustrated in FIG. 6, the MR element 1 is mounted in such a way that it slightly protrudes from the circuit board 3. Also, as shown in FIGS. 6 and 7, two dowel pins 11 are provided on the frame 8 to fit the width of the MR element 1. Since the frame 8 is resin-molded by a metal mold die or the like, recesses are arranged in the mold to form the dowel pins 11, and thus, the dowel pins 11 can be formed simultaneously with the resin-molding of the frame 8. After the thick film resistor 4 is trimmed without applying the magnetic field so as to adjust the output characteristics of the hybrid integrated circuit formed on the circuit board 3, the circuit board 3 is assembled into the frame 8 by the following method. The MR element 1 protruding from the circuit board 3 is accurately fit between the dowel pins 11, and one side of the MR element is exactly fit into contact with one side of the inner wall of the substrate mounting portion 8c of the frame 8, thus positioning the MR element 1 to fit the frame 8. According to this method, since the MR element 1 and the frame 8 can be directly positioned relative to each other, even if the MR element 1 is out of place relative to the circuit board 3, such slip of mounting position of the MR element 1 can be compensated and ignored. As stated above, the angle between the magnetic field generated by the magnet 7 and the element 1 can be exactly set, thus improving the precision of the output characteristics.

Figure 8:
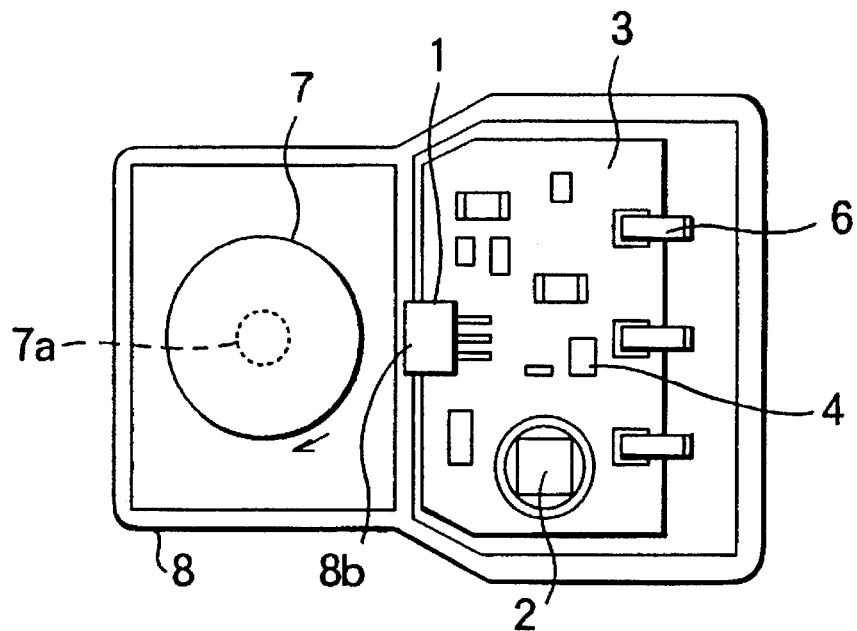
FIG. 8 is a top view of a magnetic sensor device of another embodiment of the present invention.

FIG. 8 illustrates another embodiment of the present invention. Similarly to the previous embodiment, the MR element 1 is arranged on the circuit board 3 to slightly protrude from the circuit board 3. Instead of providing the dowel pins 11 shown in FIGS. 6 and 7, a dowel recess 8b complementary to the MR element 1 is provided in the frame 8 such that the size of the dowel recess 8b fits that of the MR element 1. The MR element 1 is fit into the dowel recess 8b for positioning in order to assemble the circuit board 3 into the frame 8. Since the MR element 1 and the frame 8 are also directly positioned relative to each other, the angle between the magnetic field generated by the magnet 7 and the MR element 1 can be exactly set, thus obtaining the output characteristics with high precision.

Figure 9:
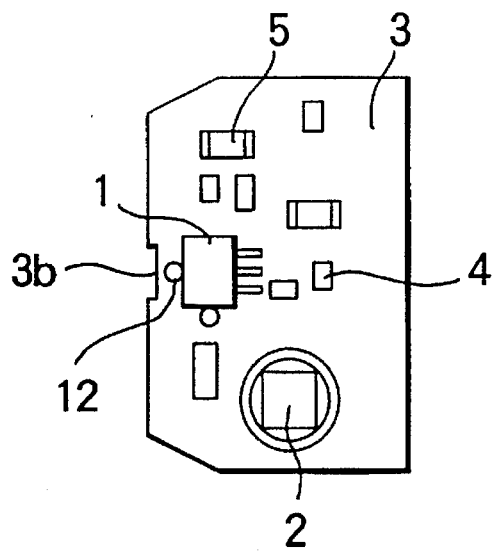
FIG. 9 is a top view of a circuit board having mounted thereon a hybrid integrated circuit of another embodiment of the present invention.

In the embodiment shown in FIG. 9, in order to prevent the MR element 1 from slipping out of place with respect to the circuit board 3, cylindrical dowel pins 12 used as first positioning means are arranged on the circuit board 3, thereby positioning the MR element 1 to be mounted. The dowel pins 12 are arranged to apply to at least two sides of the MR element 1, thus preventing the undesirable slip of mounting position of the MR element 1 relative to the circuit board 3. The dowel pins 12 are formed by printing a soldering paste or the like. If the height required for the dowel pins 12 cannot be obtained by printing at one time, printing is performed at the same portion for a plurality of times. In the top view of FIG. 9, the dowel pins 12 are formed in a cylindrical shape, instead, however, they may be formed in a squared pole-like shape. Also, three dowel pins 12 may be arranged to apply to three sides of the MR element 1. In this embodiment, after the thin film resistor 4 is trimmed without applying the magnetic field so as to adjust the output characteristics of the hybrid integrated circuit formed on the circuit board 3, the circuit board 3 is assembled into the frame 8 by the following method. A dowel recess 3b provided for the circuit board 3 and a dowel projection 8a (See FIG. 3) which is arranged on the frame 8 and which is complementary to the dowel recess 3b are used as second positioning means, thereby positioning the circuit board 3 relative to the frame 8 in a manner similar to the first embodiment. Hence, undesirable slip of mounting position between the circuit board 3 and the MR element 1 does not occur nor does it occur between the circuit board 3 and the frame 8. Accordingly, the angle between the magnetic field generated by the magnet 7 provided for the frame 8 and the MR element 1 can be exactly set, thus maintaining the output characteristics throughout before and after the assembly. Advantages similar to those in the above embodiments can be obtained in this embodiment.

As will be clearly understood from the foregoing description, the present invention offers the following advantages.

According to the magnetic sensor device and the method of manufacturing the same of the present invention, the magnetic field is applied to the MR element at a predetermined angle when the thick film resistor 4 is trimmed. Therefore, even if the MR element slipped out of place relative to the circuit board 3 when it was mounted on the circuit board 3, the thick film resistor 4 is trimmed while leaving the MR element as it is out of place, thereby compensating such slip of mounting position by means of trimming. After that, the circuit board 3 is accurately assembled into the frame 8 by the positioning means. As a result, output characteristics with high precision can be obtained.

According to the magnetic sensor device and the method of manufacturing the same of the present invention, the MR element 1 and the frame 8 are directly positioned relative to each other, thereby assembling the circuit board 3 into the frame 8. Consequently, no slip of mounting position is caused between the frame 8 and the MR element 1, thus achieving a magnetic sensor device having output characteristics with high precision.

According to the magnetic sensor device and the method of manufacturing the same of the present invention, the first positioning means are disposed on the circuit board 3 to position the MR element 1 relative to the circuit board 3 and the second positioning means are arranged between the circuit board 3 and the frame 8 to position the circuit board 3 relative to the frame 8, thereby positioning and assembling the above components. Hence, no slip of mounting position is caused, thus accomplishing a magnetic sensor device having output characteristics with high precision.

According to the method of manufacturing a magnetic sensor device of the present invention, the thick film resistor 4 is trimmed without applying the magnetic field to the MR element so as to adjust the output characteristics. Subsequently, the circuit board 3 is assembled into the frame 8 in such a way that while the output characteristics are being measured, the circuit board 3 is slid slowly and fixed in the position in which the reference voltage adjusted by trimming is equivalent to the output voltage. Hence, the undesirable slip of mounting position among the MR element 1, the circuit board 3 and the frame 8 can be compensated, and accordingly, there is no disparity between the output characteristics during trimming and those after assembly, thus improving the precision of the output characteristics.

What is claimed is:

1. A method of manufacturing a magnetic sensor device comprising the steps of:

forming a sensor circuit on a circuit board, said sensor circuit having an orthogonal-type magnetoresistance element and a thick film resistor;

trimming the thick film resistor in the absence of a magnetic field so that the output voltage of said sensor circuit matches a predetermined reference value;

mounting the circuit board to a frame, the frame having a magnet movably supported thereby, including:
(a) applying a magnetic field generated by the magnet to the sensor circuit such that the magnetic field is substantially perpendicular to the magnetoresistance element, (b) adjusting a position of the circuit board within the frame while measuring the output voltage of the sensor circuit, and (c) fixing the circuit board at a position within the frame in which the measured output voltage of the sensor circuit equals the predetermined reference value.

2. A magnetic sensor device comprising:

a frame;

a circuit board mounted to said frame;

a sensor circuit having an orthogonal-type magnetoresistance element mounted on said circuit board;

a magnet movably supported by said frame, said magnet facing said magnetoresistance element for applying a magnetic field thereto;

first positioning means for positioning said circuit board relative to said frame; and second positioning means disposed on said circuit board for positioning said magnetoresistance element relative to said circuit board wherein said second positioning means includes first and second dowel pins disposed on said circuit board, the magnetoresistance element being lodged between the first and second dowel pins.

3. A method of manufacturing a magnetic sensor device comprising the steps of:

forming a sensor circuit on a circuit boards, said sensor circuit having an orthogonal-type magnetoresistance element and a thick film resistor;

trimming the thick film resistor while a magnetic filed is applied to said circuit board at a predetermined angle so that the output voltage of said sensor circuit matches a predetermined reference value; and mounting the circuit board to a frame including aligning the circuit board with the frame wherein aligning the circuit board and the frame includes engaging a recess in the circuit board with a projection of the frame.

4. A method of manufacturing a magnetic sensor device comprising the steps of:

forming a sensor circuit on a circuit board, said sensor circuit having an orthogonal-type magnetoresistance element and a thick film resistor;

trimming the thick film resistor so that the output voltage of the sensor circuit matches a predetermined reference value;

matching the circuit board to a frame, the frame containing a magnet; and mating the magnetoresistance element with the frame wherein said mating step includes lodging the magnetoresistance element in a recess provided in the frame.

5. A method of manufacturing a magnetic sensor device comprising the steps of:

forming a sensor circuit on a circuit board, said sensor circuit having an orthogonal-type magnetoresistance element and a thick film resistor:

trimming the thick film resistor so that the output voltage of the sensor circuit matches a predetermined reference value;

mounting the circuit board to a frame, the frame containing a magnet; and mating the magnetoresistance element with the frame wherein said mating step includes lodging the magnetoresistance element between dowel pins provided on the frame.

6. A method of manufacturing a magnetic sensor device comprising the steps of:

providing a first structural member on a circuit board for securing an orthogonal-type magnetoresistance element in a desired position;

forming a sensor circuit on said circuit board, said sensor circuit including the magnetoresistance element and a thick film resistor, including mounting the magnetoresistance element on the circuit board by engaging the magnetoresistance element with the first structural member of the circuit board;

trimming the thick film resistor so that the output voltage of said sensor circuit matches a predetermined reference value; and mounting the circuit board to a frame, the frame containing a magnet and a second structural member, wherein mounting includes 1) aligning the circuit board with the frame by engaging the circuit board with the second structural member of the frame and 2) engaging the second structural member of the frame with a recess formed in the circuit board.

7. A method of manufacturing a magnetic sensor device as claimed in claim 6 wherein trimming includes trimming the thick film resistor without applying a magnetic field.

* * * * *